(12) United States Patent
Chan et al.

(10) Patent No.: US 12,237,207 B2
(45) Date of Patent: Feb. 25, 2025

(54) METHOD FOR FORMING A BURIED METAL LINE IN A SEMICONDUCTOR SUBSTRATE

(71) Applicant: IMEC VZW, Leuven (BE)

(72) Inventors: Boon Teik Chan, Wilsele (BE); Zheng Tao, Heverlee (BE); Efrain Altamirano Sanchez, Kessel-Lo (BE); Anshul Gupta, Leuven (BE); Basoene Briggs, Heverlee (BE)

(73) Assignee: Imec vzw, Leuven (BE)

( * ) Notice: Subject to any disclaimer, the term of this patent is extended or adjusted under 35 U.S.C. 154(b) by 0 days.

(21) Appl. No.: 18/469,374

(22) Filed: Sep. 18, 2023

(65) Prior Publication Data
US 2024/0006228 A1    Jan. 4, 2024

Related U.S. Application Data

(62) Division of application No. 16/934,200, filed on Jul. 21, 2020, now abandoned.

(30) Foreign Application Priority Data

Jul. 24, 2019 (EP) ..................... 19187988

(51) Int. Cl.
| | |
|---|---|
| *H01L 21/74* | (2006.01) |
| *H01L 21/8234* | (2006.01) |
| *H01L 23/528* | (2006.01) |
| *H01L 23/535* | (2006.01) |

(52) U.S. Cl.
CPC .... *H01L 21/743* (2013.01); *H01L 21/823431* (2013.01); *H01L 21/823475* (2013.01); *H01L 23/5286* (2013.01); *H01L 23/535* (2013.01)

(58) Field of Classification Search
CPC ..................................................... H01L 21/743
See application file for complete search history.

(56) References Cited

U.S. PATENT DOCUMENTS

| | | |
|---|---|---|
| 5,504,038 A | 4/1996 | Chien et al. |
| 7,064,064 B2 | 6/2006 | Chen et al. |
| 9,825,032 B1 | 11/2017 | Bentley et al. |
| 10,020,381 B1 | 7/2018 | Fan et al. |
| 10,998,238 B2 | 5/2021 | Ching et al. |
| 2018/0294267 A1 | 10/2018 | Licausi et al. |
| 2018/0374791 A1 | 12/2018 | Smith et al. |
| 2019/0139891 A1 | 5/2019 | Ohtou et al. |
| 2020/0176448 A1 | 6/2020 | Huang et al. |

OTHER PUBLICATIONS

Extended European Search Report, EP Application No. 19187988.1, mailed Oct. 18, 2019, 7 pages.
Copending U.S. Appl. No. 16/934,200, filed Jul. 21, 2020.

*Primary Examiner* — Daniel Luke
(74) *Attorney, Agent, or Firm* — McDonnell Boehnen Hulbert & Berghoff LLP

(57) ABSTRACT

A method for forming a buried metal line in a semiconductor substrate comprises forming, at a position between a pair of semiconductor structures, a metal line trench in the semiconductor substrate at a level below a base of each semiconductor structure of the pair, and forming the metal line in the metal line trench by means of area selective deposition of a metal line material, followed by embedding the pair of semiconductor structures in an insulating layer.

8 Claims, 10 Drawing Sheets

METHOD FOR FORMING A BURIED METAL LINE IN A SEMICONDUCTOR SUBSTRATE

CROSS-REFERENCE TO RELATED APPLICATIONS

The present application is a division of U.S. application Ser. No. 16/934,200 and claims the benefit of priority to European Application No 19187988.1, filed on Jul. 24, 2019, the entire contents of both of which are hereby incorporated by reference.

FIELD OF THE DISCLOSURE

This application relates to semiconductor processing, and more particularly to a method for forming a buried metal line in a semiconductor substrate.

BACKGROUND

Integrated circuits typically comprise power rails (for example, for VSS and VDD supply voltage distribution). Conventionally, power rails are encapsulated within a back-end-of-line (BEOL) interconnect structure located above the level of the active physical devices (e.g., transistors). In contrast, a "buried" power rail (BPR) is at least partly lowered into the substrate, such that the power rail may be located at a level below the active physical devices. Burying power rails facilitates increasing the cross-section of the power rails to be increased, which can reduce the line resistance, without occupying valuable space in the BEOL interconnect structure, which can be used for other purposes such as, for example, signal lines. As an example, in the context of fin field-effect transistor (i.e., finFET) technology, BPR formation may involve etching trenches in the substrate at positions between pairs of adjacent fins. The trenches may subsequently be filled with metal to form the BPRs.

SUMMARY

It is envisaged that the use of BPR will be challenging in future smaller technology nodes, since it may be difficult to process the BPR with a maintained quality as the critical dimension, CD, is reduced and the aspect ratio increased. In particular, quality problems related to trench etching, metal filling, and etch-back are envisaged.

In view of this, it is an objective of the application to provide an improved method for forming buried power rails or more generally buried metal lines. Further and alternative objectives may be understood from the following.

According to an aspect, there is provided a method for forming a buried metal line in a semiconductor substrate. The method comprises:
  at a position between a pair of semiconductor structures protruding from the semiconductor substrate, forming a metal line trench in the semiconductor substrate at a level below a base of each semiconductor structure of the pair, line material,
  forming the metal line in the metal line trench via selective deposition of a metal subsequently embedding the pair of semiconductor structures in an insulating layer.

These aspects simplify the metallization process for forming the buried metal line. With the present method, the metal line material can be selectively deposited prior to embedding the pair of semiconductor structures in the insulating layer. This is an improvement over techniques in which the metal line material is deposited in a trench etched through the insulating layer for several reasons.

First, there is no need to form a trench in the insulating layer to be filled with the metal line material and recessed back down to the base of the pair of semiconductor structures. The forming of a trench in the insulating layer can be a complicated process, in particular for the increasing aspect ratios associated with the effort to scale to smaller physical dimensions. In example embodiments, the metal line is defined without requiring the etching of such a trench.

Second, forming the metal line through a trench in the insulating layer generally requires the metal line material to be etched back in the trench, towards the base of the pair of semiconductor structures. This etch-back process may be impaired with uniformity related issues and risks damaging other structures. Thus, in example embodiments, selective deposition is utilized to form the metal line, which can be done without an etch-back of the metal line material through a trench in the insulating layer.

As used herein, the term "buried metal line" refers to a metal line structure that is at least partially embedded in the substrate. As described in further detail below, the metal line may be formed with a height less than a height of the metal line trench and completely embedded/buried in the substrate. The metal line may also be formed with a height exceeding a height of the metal line trench and partially embedded/buried in the substrate.

The pair of semiconductor structures may be formed by a pair of semiconductor bodies, such as a pair of semiconductor fins (e.g., finFETs), or a pair of nanosheets or lateral nanowires.

A may be appreciated, the pair of semiconductor structures may comprise a pair of mutually facing sidewall surfaces (i.e., a pair of sidewall surfaces in a mutually facing relationship), which in the following may be referred to as the pair of mutually facing sidewall surfaces of the pair of semiconductor structures. The pair of mutually facing sidewall surfaces of the pair of semiconductor structures may be formed on mutually opposite sides of the metal line trench to be formed.

Reference may herein be made to a "vertical" direction to denote a direction along a normal to the substrate (i.e., a normal to a main/upper surface of the substrate). Meanwhile, "vertical" qualifiers such as "below" and "above" may be used to refer to relative positions with respect to the vertical direction, and do not necessarily imply an absolute orientation of the substrate. Accordingly, the term "below" may be used to refer to a relative position closer to the main surface of the substrate. The term "above" may be used to refer to a position farther from the main surface of the substrate. For example, a first level or element located below a second level or element implies that the first level or element is closer to the main surface of the substrate than the second level or element. Conversely, a first level or element located above a second level or element implies that the first level or element is farther from the main surface of the substrate than the second level or element.

The term "horizontal" may be used to denote a direction or orientation parallel to the substrate (i.e., the main plane of extension or main surface thereof), or equivalently transverse to the vertical direction. Further, a lateral direction may be understood as a horizontal direction.

The metal line material may be deposited using several different techniques, as will be discussed in the following in connection with various embodiments.

According to some embodiments, the metal line may be formed via an area selective process in which the metal line material is provided primarily in the metal line trench, and the deposition of material outside the trench is hindered. The selectivity may be achieved by various techniques that facilitate providing a surface specificity between growth areas, in which the metal line material is desired, and non-growth areas, in which metal line material is not desired. The growth areas may generally be provided within the metal line trench, whereas the non-growth areas may be provided outside the trench. As a result, in some examples, metal line material is only provided in the metal line trench. The surface specificity may be achieved via, for example, area selective epitaxy, area selective chemical vapor deposition, CVD, and the deactivation of non-growth surfaces. The non-growth areas may, for example, be provided with a growth-inhibiting layer, which may be provided on surfaces outside the metal line trench. Further, the selective deposition process may be combined with selective etching to remove metal line material that may have formed on non-growth areas.

In one example, a growth-promoting layer may be provided in the metal line trench in order to promote the selective growth of the metal line material in the trench. The growth-promoting layer may be provided in the trench prior to the forming of the metal line in the trench, and may further serve the purpose of a barrier layer between the metal line material and the substrate. It will be appreciated that the growth-promoting layer may be formed of one or several layers and that the layer(s) may be provided on the bottom surface and the sidewalls of the trench or on the bottom surface only.

According to an embodiment, the growth-promoting layer may comprise a silicide. The silicide may, for example, be formed by deposition of a silicide metal, such as titanium, followed by an annealing operation in which the silicide metal reacts with the material of the substrate to form a silicide. The silicide metal may be prevented from forming a silicide in non-growth areas, such as areas outside the metal line trench and on dielectric surfaces of, for instance, silicon nitride or silicon oxide, by first providing an intermediate layer on the non-growth areas. Thus, the silicide may be formed only on surfaces for which the silicide metal is provided directly on the silicon substrate. The intermediate layer may form a barrier between the silicide metal and the underlying silicon, thus preventing silicide from forming in those areas. The intermediate layer may, for example, comprise a nitride, such as $Si_3N_4$, forming a liner on the pair of semiconductor structures. The liner may be provided prior to the forming of the metal line trench, such that the surfaces of the resulting trench are free from the liner material and thus can form a silicide with the silicide metal. The non-reacted silicide metal may be removed after the anneal, for example, via a wet etch.

The metal line trench may, for example, be formed in a lithographic process, or via a spacer patterning process. Lithographic patterning may be a relatively fast and simple process, whereas spacer patterning may be utilized to achieve a self-alignment and provide pattern features with linewidths smaller than those that can be achieved by conventional lithography. In one example, the metal line trench may be formed by providing a spacer on sidewall surfaces of the pair semiconductor structures so as to define an etch mask protecting the sidewall surfaces, while the metal line trench is etched into the substrate between the pair of semiconductor structures.

Forming the spacer may comprise conformally depositing a spacer layer, and anisotropically etching the spacer layer to expose the region between the pair of semiconductor structures in which the metal line trench is to be defined. The thickness of the spacer may be precisely controlled by controlling the thickness of the deposited spacer layer. Owing to the conformal deposition, the spacer layer may be deposited on the sidewall surfaces and the bottom surface of the space between the pair of semiconductor structures. Alternatively, or additionally, lithography may be used to pattern an etch mask through which the spacer layer may be etched to expose the metal line trench region of the substrate.

After etching the metal line trench, a growth-promoting layer and/or barrier layer may be provided in the trench in a manner similar to that described for the embodiment above. In one example, the trench etch may be followed by the formation of an oxide layer, such as $SiO_2$ in the trench and on the spacer, and thereafter a deposition of a silicidation metal comprising, for example, titanium. The metal line trench, or at least a bottom part of the trench, may then be provided with a mask layer that protects the underlying silicidation metal in a subsequent etch-back process. The remaining silicidation metal may be used to facilitate the selective growth of metal line material in the trench. Preferably, the metal line material is deposited while the spacer remains on the pair of semiconductor structures, such that any metal line material that has deposited on areas outside the metal line trench can be removed together with the spacer so as to further increase the selectivity of the metal line material deposition process.

In a further example, the metal line material, which may at least partly fill the metal line trench and the gap defined by the sidewall spacers, may be subjected to an etch-back process in which the metal line material may be recessed back towards the metal line trench. The etch-back process may determine the height of the metal line, which, for example, may exceed a depth of the metal line trench so as to facilitate subsequent contacting from above. By allowing the metal line trench to protrude from the metal line trench, the depth of the contact via required to access the buried metal line through the insulating layer may be reduced.

BRIEF DESCRIPTION OF THE FIGURES

The above, as well as additional objects, features, and aspects of the present inventive concept, will be better understood through the following illustrative and non-limiting detailed description, with reference to the appended drawings. In the drawings like reference numerals will be used for like elements unless stated otherwise.

FIG. 1 illustrates a plurality of semiconductor structures or fins protruding from a semiconductor substrate, in accordance with an example embodiment.

FIG. 2 illustrates an insulating liner formed on the fins and on the surface of the substrate, in accordance with an example embodiment.

FIG. 3 illustrates an etch mask patterned to define a metal line trench between the fins, in accordance with an example embodiment.

FIG. 4 illustrates an etched metal line trench, in accordance with an example embodiment.

FIG. 5 illustrates a metal barrier layer conformally deposited on the insulating liner, in accordance with an example embodiment.

FIG. 6 illustrates fins covered with a liner and the metal line trench provided with a silicide trench barrier layer, in accordance with an example embodiment.

FIG. 7 illustrates selectively depositing a metal line material in the metal line trench, in accordance with an example embodiment.

FIG. 8 illustrates an additional liner deposited to cover the metal line formed by the metal line material in the trench, in accordance with an example embodiment.

FIG. 9 illustrates a semiconductor device after the removal of a hard mask from the fins, in accordance with an example embodiment.

FIG. 10 illustrates a spacer formed on sidewall surfaces of the fins and on surface portions of the substrate between the fins, in accordance with an example embodiment.

FIG. 11 illustrates an etch mask lithography patterned to protect a spacer layer, in accordance with an example embodiment.

FIG. 12 illustrates a structure with a metal line trench, where the spin-on etch mask is removed, and the sidewalls of the metal line trench are covered with a liner and a metal barrier layer, in accordance with an example embodiment.

FIG. 13 illustrates the structure of FIG. 12 after the structure has been coated with a mask material, in accordance with an example embodiment.

FIG. 14 illustrates the structure of FIG. 13 after the mask material has been etched back, in accordance with an example embodiment.

FIG. 15 illustrates metal line material deposited on the structure, in accordance with an example embodiment.

FIG. 16 illustrates the structure after depositing a capping liner, in accordance with an example embodiment.

FIG. 17 illustrates an insulating layer that buries the metal line in the substrate, in accordance with an example embodiment.

FIG. 18 illustrates the structure after the hard mask of the fins has been removed, and the insulating layer recessed to expose an upper portion of the fins, in accordance with an example embodiment.

FIG. 19 illustrates a structure similar to the structure of FIG. 12, in which the metal line trench and the gap defined by the spacer layer on the fins have been filled with a metal line material, in accordance with an example embodiment.

FIG. 20 illustrates the structure after the metal line material, and the metal barrier layer is etched back, in accordance with an example embodiment.

Figure 1:
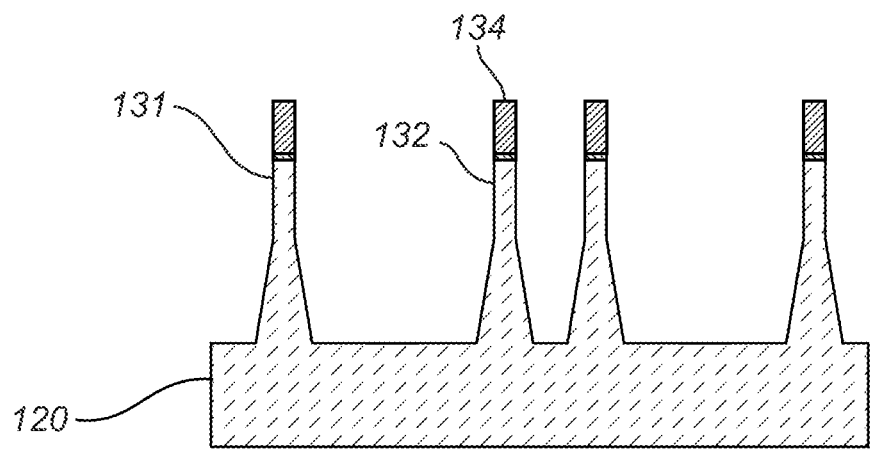
FIGS. 1 to 20 are cross-sections illustrating method steps for forming a buried metal line in a semiconductor substrate, in accordance with various example embodiments.

All the figures are schematic, not necessarily to scale, and generally only show parts that are necessary to elucidate example embodiments, wherein other parts may be omitted or merely suggested.

DETAILED DESCRIPTION

Example embodiments for forming a buried metal line in a semiconductor will now be described more fully hereinafter with reference to the accompanying drawings. That which is encompassed by the claims may, however, be embodied in many different forms and should not be construed as limited to the embodiments set forth herein. Rather, these embodiments are provided by way of example. Furthermore, like numbers refer to the same or similar elements or components throughout.

The figures in the drawings schematically show, in cross-sections, a semiconductor device comprising a substrate 120 and a pair of semiconductor structures 131, 132 (hereinafter "fins" 131, 132) protruding from the substrate 120. The following methods will be described in relation to a single pair of fins 131, 132, and for forming a single buried metal line. However, as indicated in some of the figures, the method steps may be applied in parallel at a plurality of positions along the substrate to form buried metal lines between a plurality of pairs of fins. It may be further noted that the relative dimensions of the shown structures, for instance, the relative thickness of layers, are merely schematic and may, for the purpose of illustrational clarity, differ from a physical device structure.

The substrate 120 may be a semiconductor substrate, i.e., a substrate comprising at least one semiconductor layer. The substrate 120 may be a single-layered semiconductor substrate, for instance, formed by a bulk substrate. The substrate may, however, also be a multi-layered substrate, for instance, formed by an epitaxially grown semiconductor layer on a bulk substrate, or a semiconductor-on-insulate (SOI) substrate. The substrate 120 may, for instance, comprise a layer of silicon (Si), germanium (Ge) or silicon-germanium (SiGe), etc.

As indicated in FIG. 1, the fins 131, 132 protrude in a vertical direction, or equivalently in parallel to a normal direction with respect to the substrate 120. The pair of fins 131, 132 may be spaced apart along a first horizontal direction and may extend in parallel to each other in a second horizontal direction. The horizontal directions may be mutually perpendicular along the substrate 120. The pair of fins 131, 132 may define a pair of mutually facing sidewall surfaces, which, as will be shown, may be located on opposite sides of the metal line, which is to be formed between the pair of fins 131, 132.

The fins 131, 132 may, for example, comprise Si, Ge, or SiGe. The semiconductor structures 131, 132 may be homogenous, single-layered semiconductor bodies, for example, patterned in a single semiconductor layer of the substrate 120. The semiconductor structures 131, 132 may also be multi-layered semiconductor bodies, such as a superlattice of, for instance, Si/SiGe layers, which may facilitate lateral gate-all-around (GAA) device formation. The multi-layered semiconductor bodies may, for example, be patterned in a stack of semiconductor layers of the substrate 120. The fins may be formed on the substrate 120 in a fin patterning process in a conventional manner. The semiconductor fins may be used for forming horizontal channel devices, such as finFETs extending across the fin.

FIG. 1 illustrates a plurality of semiconductor structures, i.e., the fins protruding from the semiconductor substrate 120. In the following, two of the fins 131, 132, forming a pair, will be discussed in order to illustrate various aspects. The fins 131, 132 may, for example, be patterned in a Si substrate 120 via a hard mask 134 on top of the fins 131, 132, as illustrated.

Figure 2:
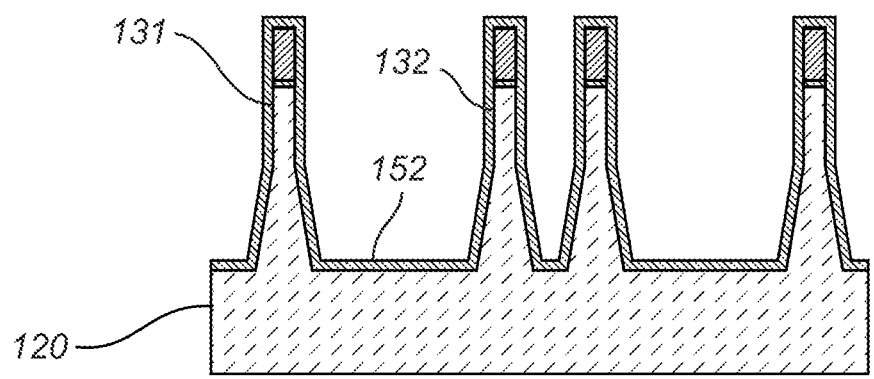

In FIG. 2, an insulating liner 152 has been formed on the fins 131, 132, and on the surface of the substrate 120 extending between the fins 131, 132. The liner 152 may, for instance, be an oxide or nitride that facilitates area selective deposition (ALD), such as $SiO_2$, SiN, or $Si_3N_4$. The liner 152 may be provided to prevent oxidation of the fins 131, 132 during, for example, shallow trench isolation (STI) deposition and annealing.

Figure 3:
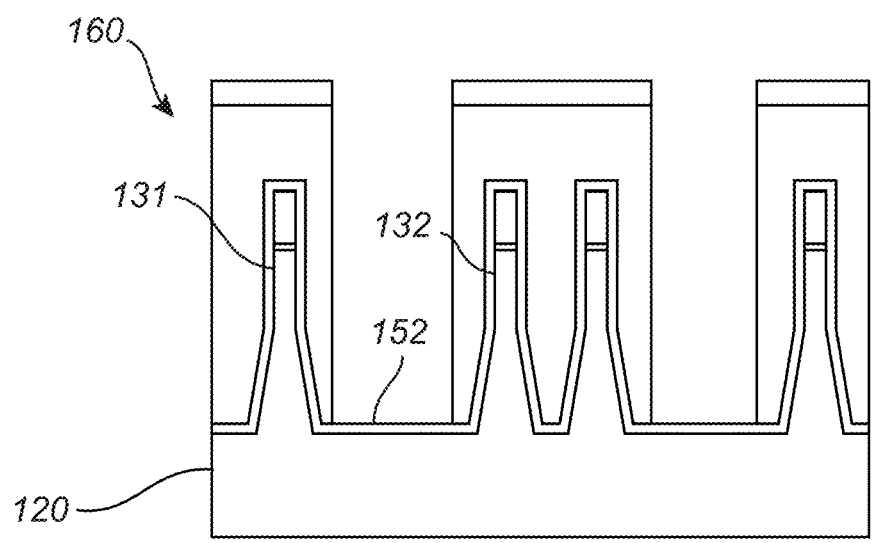
Figure 4:
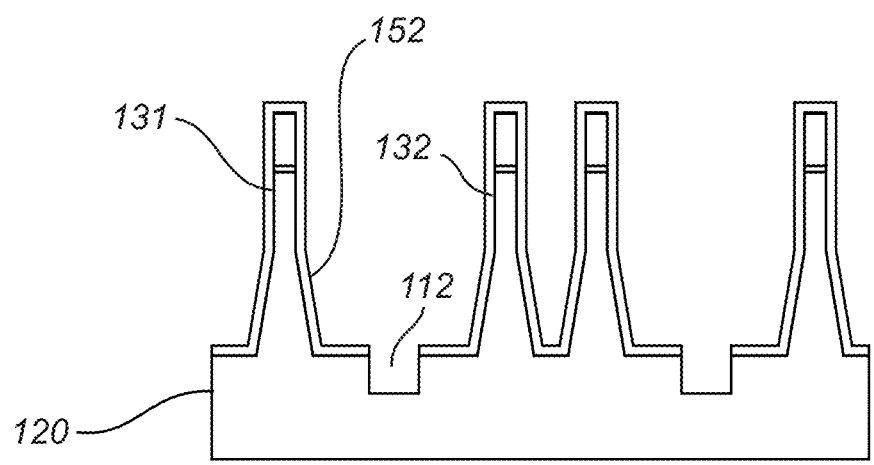

In a subsequent step, the metal line trench 112 is formed. In the present example, this is done by way of lithography. As shown in FIG. 3, an etch mask 160 comprising a stack of spin-on-glass, and spin-on-carbon has been patterned to define the metal line trench between the pair of fins 131, 132. FIG. 4 shows the result after the metal line trench 112 has been etched through the liner 152 and into the silicon substrate 120 and the etch mask 160 removed.

Figure 5:
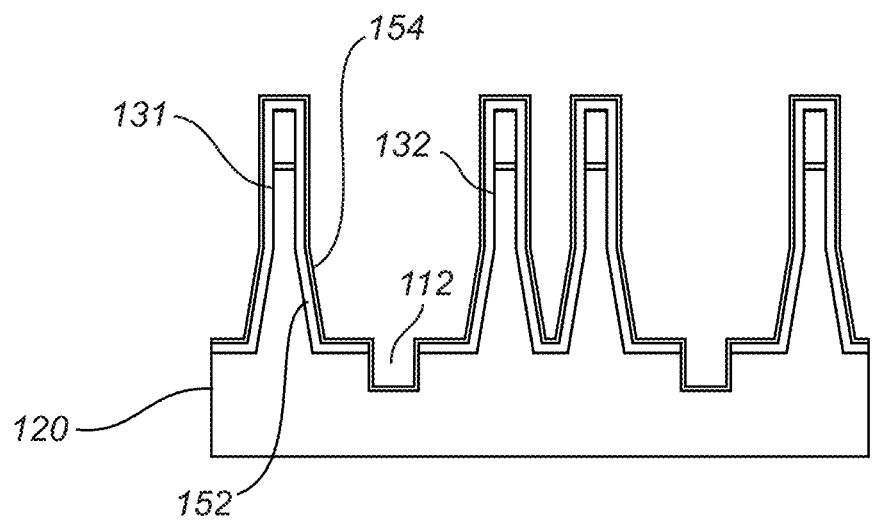

In FIG. 5, a metal barrier layer 154 has been conformally deposited on the liner 152, covering sidewall surfaces of the fins 131, 132, as well as in the metal line trench 112. The metal barrier layer 154 may be a layer of TiN deposited, for instance, by ALD. However, the metal barrier layer 154 may also be formed by any other metal, which allows the metal barrier layer 154 to act as a barrier and adhesion layer for the subsequently deposited metal line material. Due to the conformal deposition, the sidewalls of the metal line trench 112 may be reliably covered.

Figure 6:
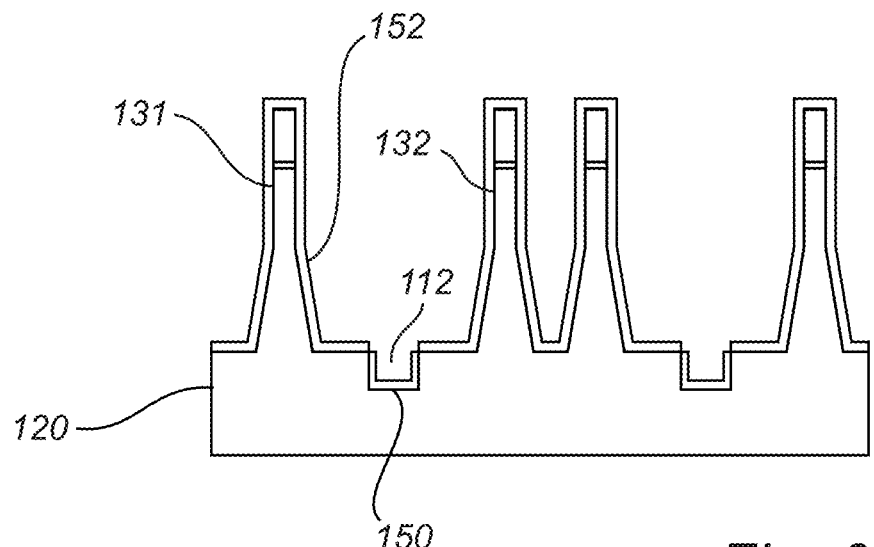

In an example embodiment, the metal barrier layer 154 comprises a silicide metal that is configured to form a silicide with the silicon in the metal line trench 112. An example is shown in FIG. 6, in which a layer of TiN 154 has been annealed to form a silicide. The silicide tends to be selectively formed in the metal line trench 112 since the silicidation metal 154 was deposited directly on the silicon surfaces of the metal line trench 112. Outside of the trench 112, the silicidation metal 154 was deposited on the liner 152, which prevents the metal 154 from forming a silicide with the silicon.

After annealing, the remaining silicidation metal 154, i.e., the parts of the metal barrier layer 154 that have not reacted to form the silicide, may be removed by, for example, a wet etch. The result is illustrated in FIG. 6, showing the fin pair 131, 132 covered with the liner 152, and the metal line trench 112 provided with a trench barrier layer 150 comprising silicide. The trench barrier layer 150 may facilitate a selective deposition of a metal line material, as will be illustrated in the following.

Figure 7:
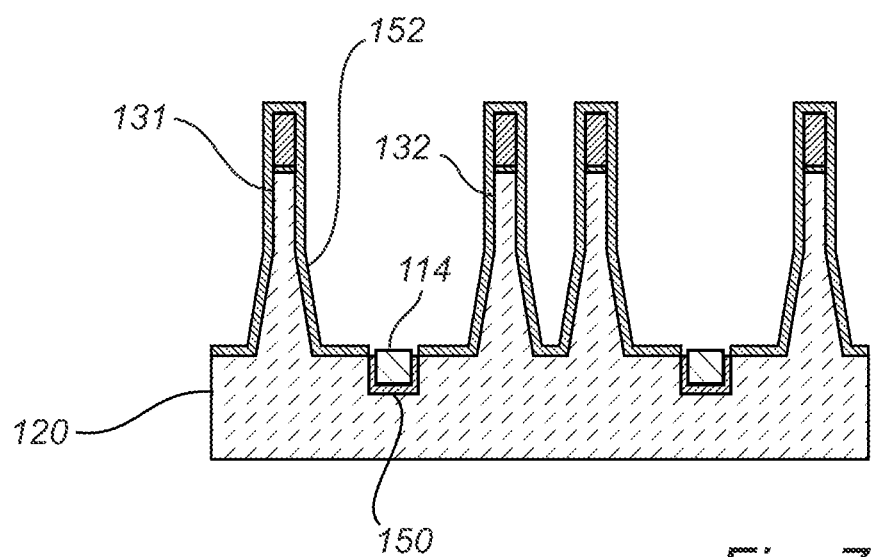

In FIG. 7, a metal line material 114 has been selectively deposited in the metal line trench 112. Examples of metals for the metal line include Co, W, Ni, Ru, and Al. The metal(s) may be deposited by conventional deposition techniques such as physical vapor deposition (PVD), CVD, or ALD, or electroless plating of, for example, Co. The metal 114 is selectively deposited on the silicided trench barrier layer 150 while not nucleating on the liner 152 covering the sidewalls of the fins 131, 132. The metal line material 114 may be deposited until the metal line trench 112 is filled, and in some examples, until the resulting metal line 110 protrudes above the trench 112. The selective deposition of the metal line material 114, a process also referred to sometimes as an area selective deposition, ALD, is facilitated by the liner 152 acting as a growth-inhibiting layer on non-growth areas, and by the silicide acting as a growth-promoting layer on the growth areas (i.e., the sidewalls of the metal line trench 112).

The surface specificity between growth areas and non-growth areas may be further increased by combining the above deposition with etching, in which case any metal line material that may have formed on non-growth areas is removed.

Figure 8:
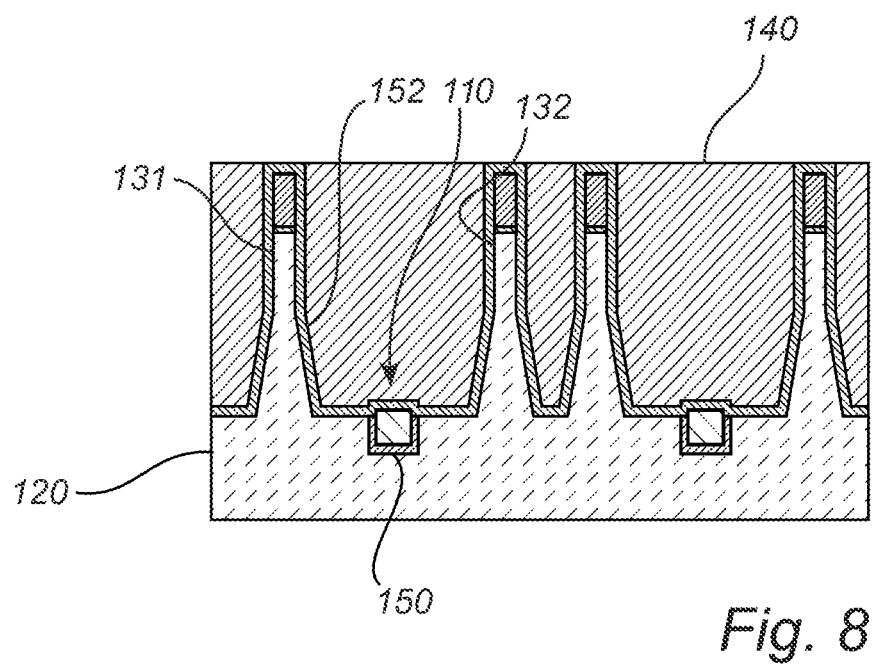

In FIG. 8, an additional liner 152 of, for instance, $Si_3N_4$ has been deposited to cover the metal line 110 formed by the metal line material 114 in the trench 112. Thereafter, an insulating layer 140 has been provided, burying the metal line 110 in the substrate 120 and embedding the fins 131, 132. The insulating layer 140 may, for example, comprise an oxide, such as $SiO_2$, and may form an STI layer.

Figure 9:
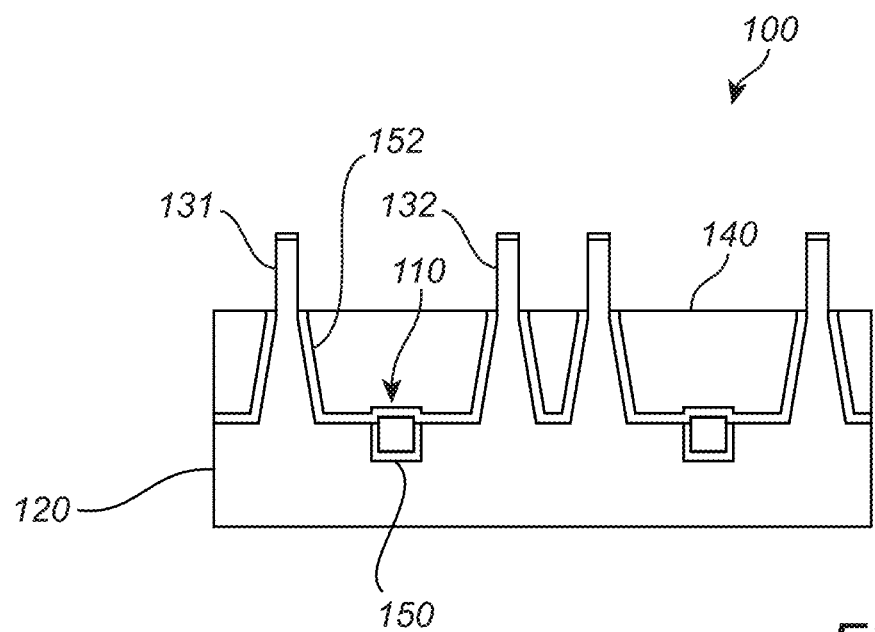

As shown in FIG. 9, in the resulting semiconductor device 100, the hard mask 134 on the fins 131, 132 has been removed, and the insulating layer 140 recessed to expose an upper portion of the fins 131, 132. The upper portion of the fins 131, 132 may provide an active area or device area in which, for example, finFETs may be formed in subsequent processes.

Figure 10:
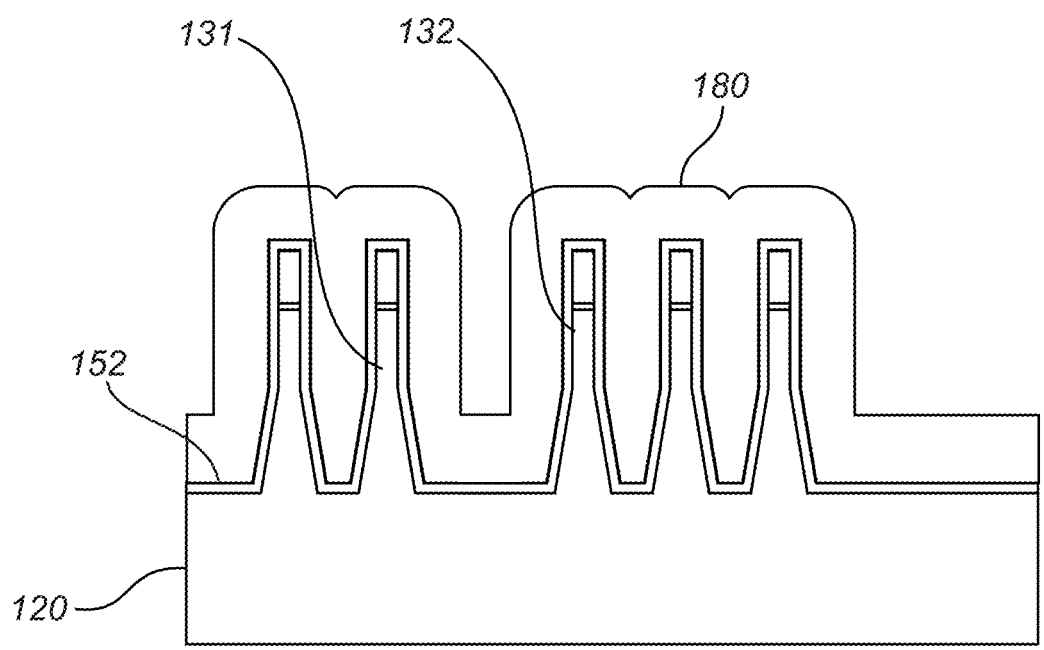
Figure 11:
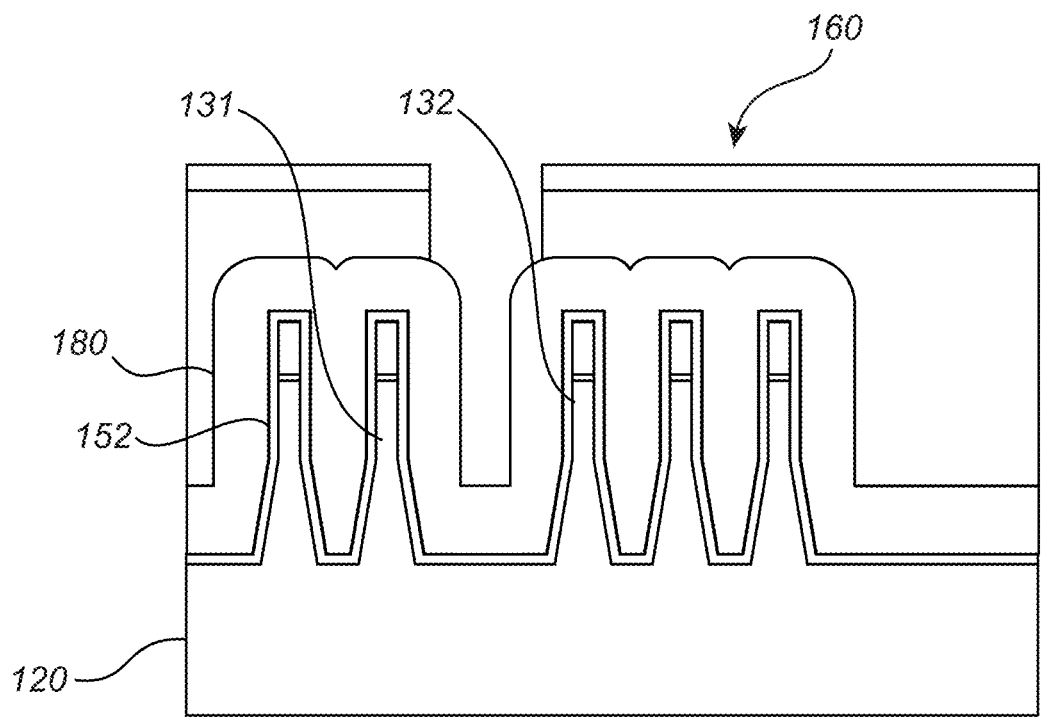
Figure 12:
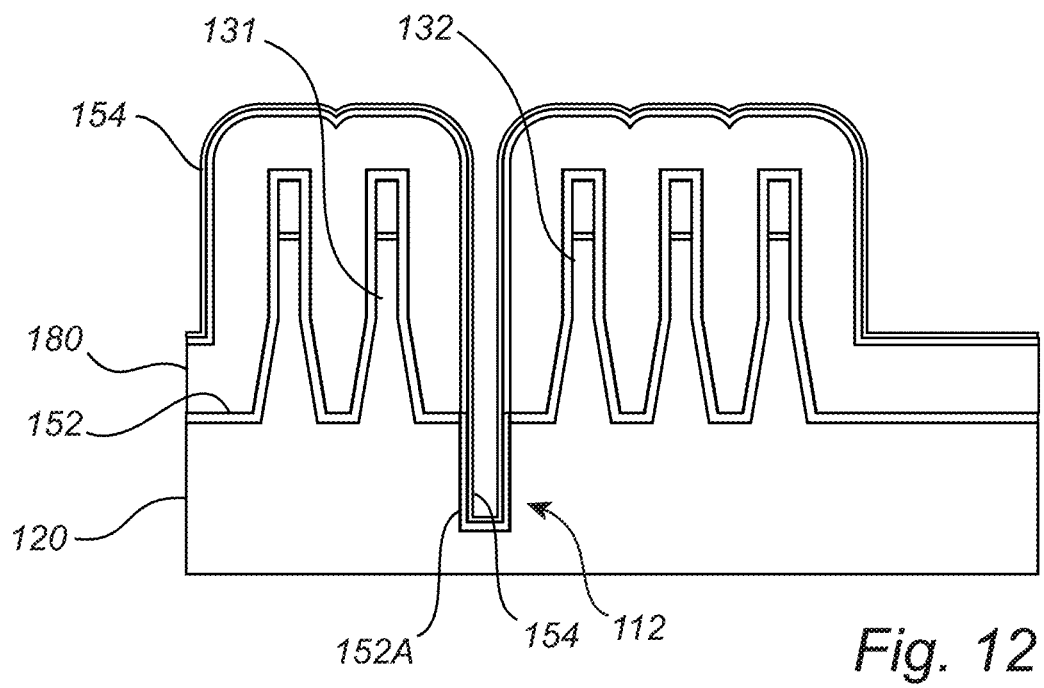

FIGS. 10 to 12 show a variation of a method of forming the buried metal line. The method proceeds in a similar manner as outlined in relation to FIGS. 1 to 9, but differs in the steps for forming the metal line trench 112 in the substrate 120. In FIG. 10, a spacer 180 has been formed on sidewall surfaces of the fins 131, 132, and on surface portions of the substrate 120 between the fins 131, 132. The spacer 180 may, for example, comprise a conformally deposited layer of, for instance, $SiO_2$. As shown in FIG. 10, the thickness of the spacer layer 180 may, together with the spacing of the fins 131, 132, define a gap between the sidewalls of the fins 131, 132 facing each other. This gap may be used to define the metal line trench in a self-aligned manner.

In FIG. 11, an etch mask 160 comprising, for instance, a stack of spin-on-glass and spin-on-carbon, has been patterned by way of lithography to protect the spacer layer 180 while the metal line trench 112 is etched. The spacer layer 180 may be etched in an anisotropic etch, during which the sidewalls of the fins 131, 132 are masked by the spacer layer 180. As shown in FIG. 11, the spin-on etch mask 160 may be used to protect the horizontal surfaces of the spacer layer 180 during the trench definition.

In FIG. 12, the metal line trench 112 has been formed, the spin-on etch mask 160 has been removed, and the sidewalls of the metal line trench 112 are covered with a second liner 152A and a metal barrier layer 154 similar to the ones described in connection with FIG. 5. In the present example, the second liner 152A may comprise, for instance, SiN or $SiO_2$.

Two illustrative examples of the deposition of the metal line material in a self-aligned metal line trench, which may be formed by means of the spacer shown in FIGS. 10-12, will be discussed in the following paragraphs. FIGS. 13-18 outline a first example, whereas FIGS. 19-20 outline a second example.

Figure 13:
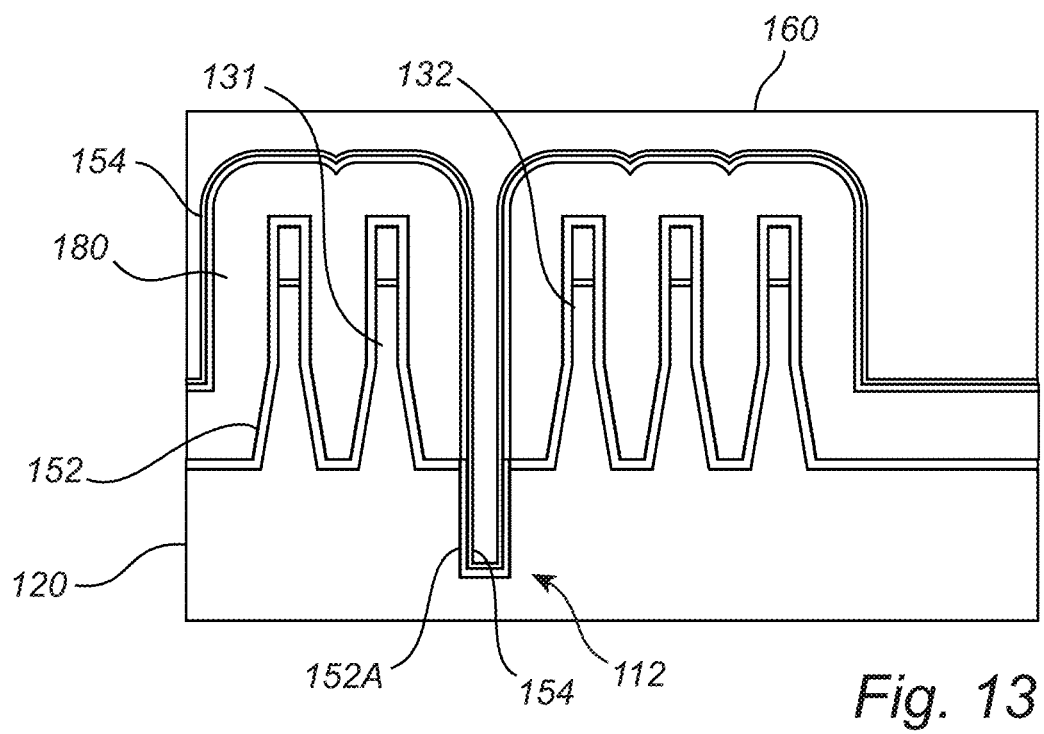

FIG. 13 shows the structure of FIG. 12 after it has been coated with a mask material 160, such as for example, a spin-on-carbon. The mask material 160 may fill the metal line trench 112, the gap between the pair of fins 131, 132, and form a layer above the fins 131, 132.

Figure 14:
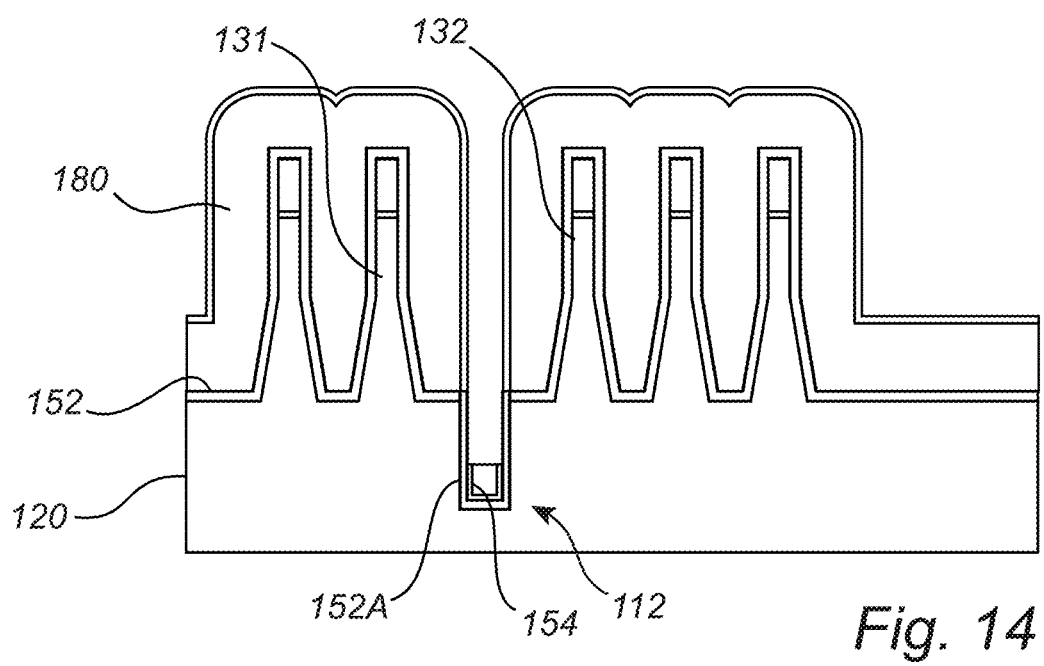
Figure 15:
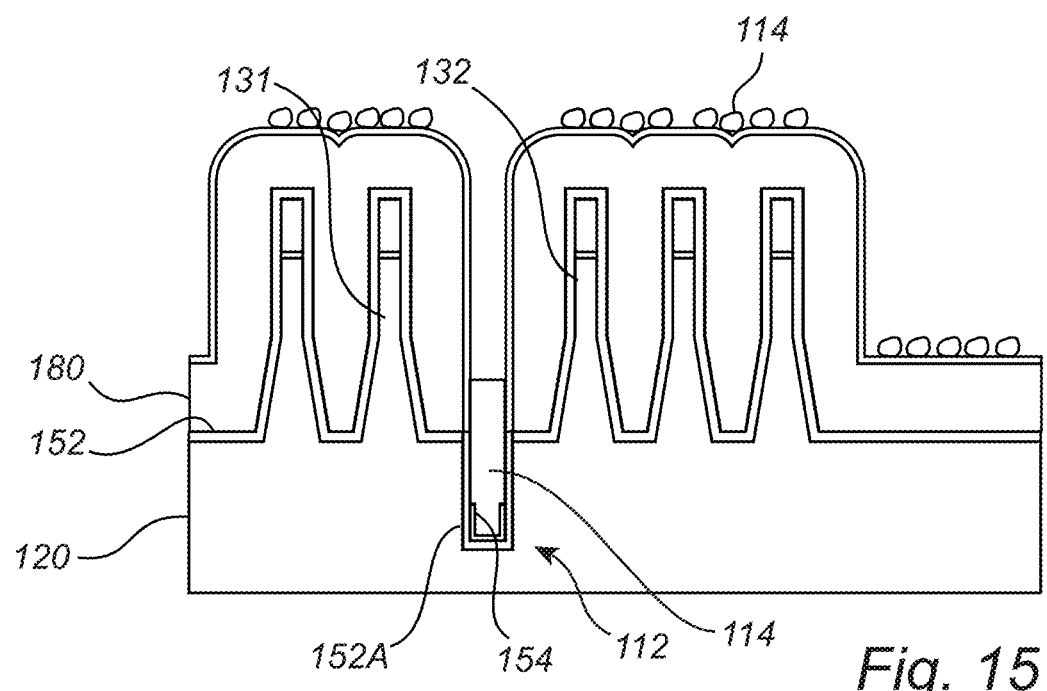

In FIG. 14, the mask material 160 has been etched back such that only a portion of the mask material 160 remains in the bottom of the metal line trench 112. The remaining mask material 160 protects the metal barrier layer 154 in the bottom of the metal line trench 112 during a subsequent etch, in which the metal barrier layer 154 may be removed from the rest of the trench 112 and the spacer layer 180 defining the gap between the fins 131, 132. The metal barrier layer 154, which, for example, may be a layer of TiN, can be etched selectively to the mask material, which, for example, may be a SoC, by means of, for instance, an ammonia hydroxide-hydrogen peroxide-water mixture (APM) or a hydrochloric acid-hydrogen peroxide-water mixture (HPM). The remaining metal barrier layer 154, which has been protected by the mask material 160, may, in this example, serve the purpose of facilitating a selective deposition of the metal line material 114 in the trench 112. As shown in FIG. 15, the metal line material 114, which for instance, may comprise Ru or W, may be deposited by way of, for example, CVD. The metal barrier layer 154, which, for instance, may comprise TiN, may form a nucleation layer onto which the metal line material 114 may grow during the deposition, while the second liner 152A of, for example, $SiO_2$ may act as a growth-inhibiting layer.

Figure 16:
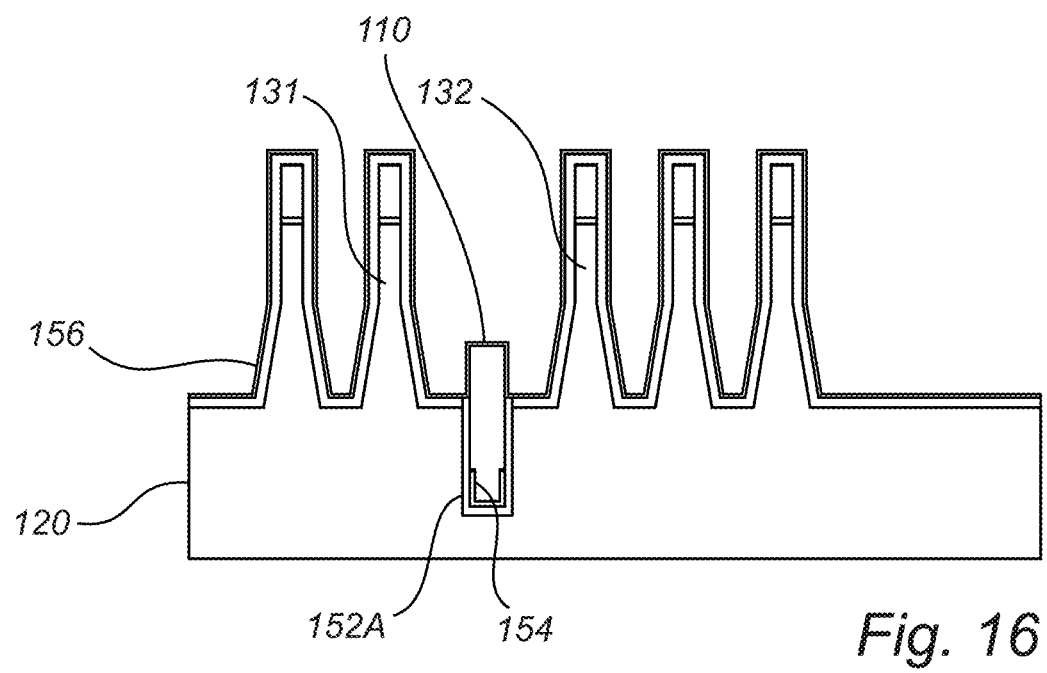

After deposition, the second liner 152A and the spacer layer 180 may be removed in, for example, a wet etch. This etch will also remove any metal line material 114 that may have been deposited outside the trench 112, such as, for example, on the horizontal surfaces of the spacer layer 180 above the fins 131, 132, as indicated in FIG. 15, and at sidewalls of the fins 131, 132. The result is shown in FIG. 16, in which a capping liner 156 has been deposited after the removal of the spacer layer 180. The capping liner 156 may be similar to the second liner 152A provided in, for example, FIG. 2, and may in some examples comprise $Si_3N_4$. The capping liner may further cover the metal line 110, which has been defined by the selective deposition of the metal line material 114 in the trench 112.

Figure 17:
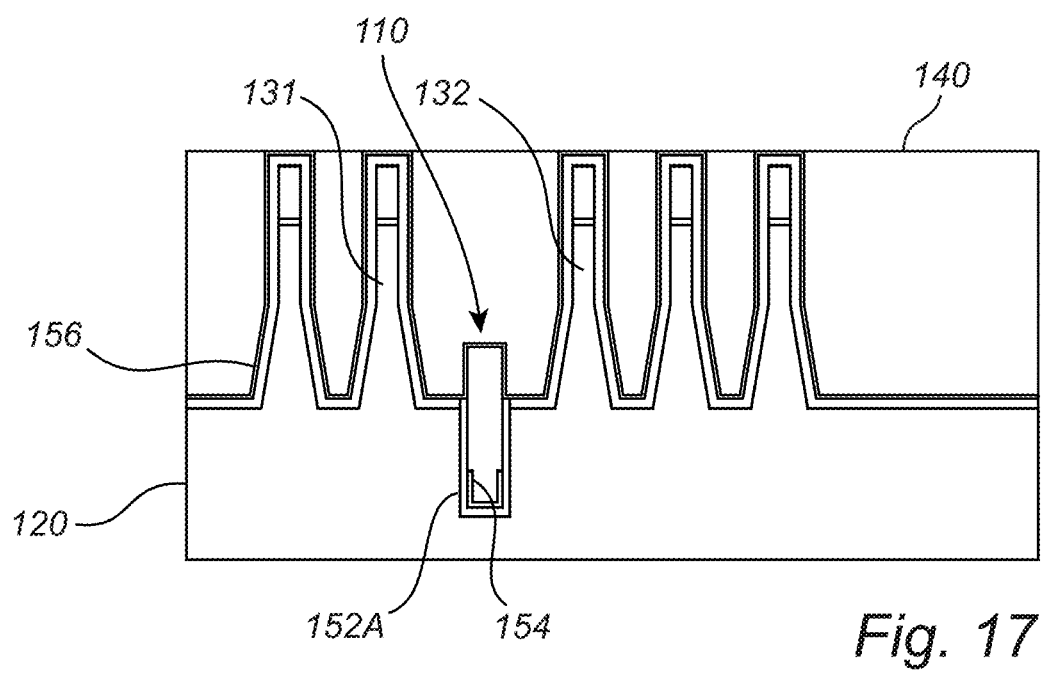

Thereafter, an insulating layer 140 may be provided, burying the metal line 110 in the substrate 120 and embedding the fins 131, 132, as shown in FIG. 17. The insulating layer 140 may, for example, comprise an oxide, such as $SiO_2$, and may form an STI layer.

Figure 18:
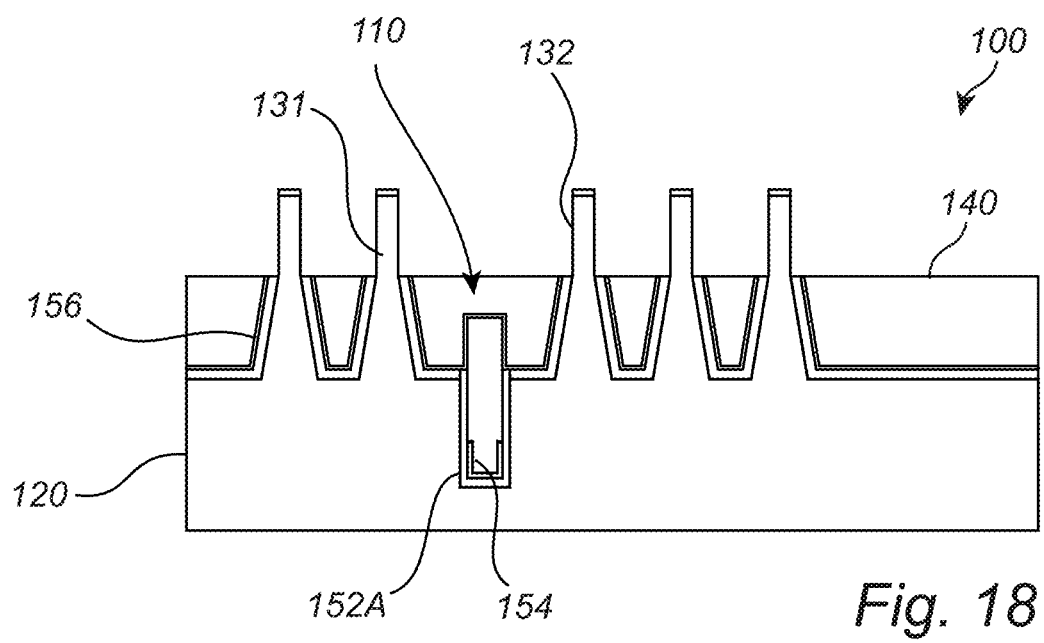

The resulting semiconductor device 100 is shown in FIG. 18, in which the hard mask 134 of the fins 131, 132 has been removed, and the insulating layer 140 recessed to expose an upper portion of the fins 131, 132 in a similar way as discussed in connection with FIG. 9.

Figure 19:
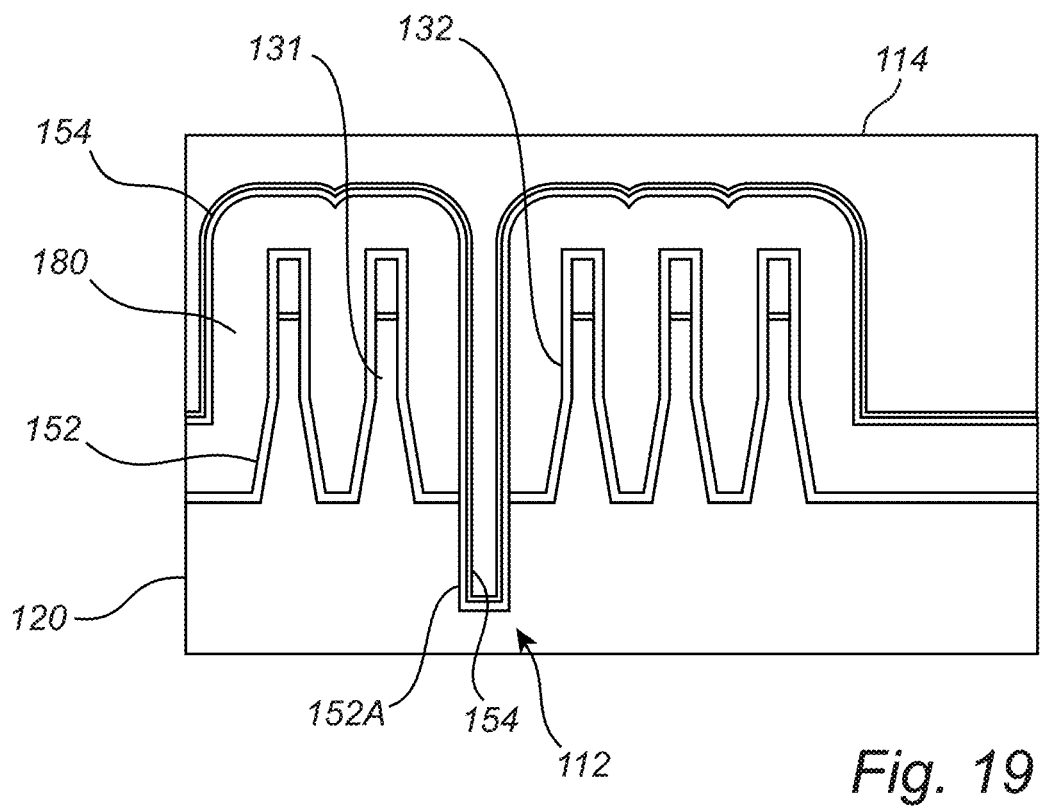
Figure 20:
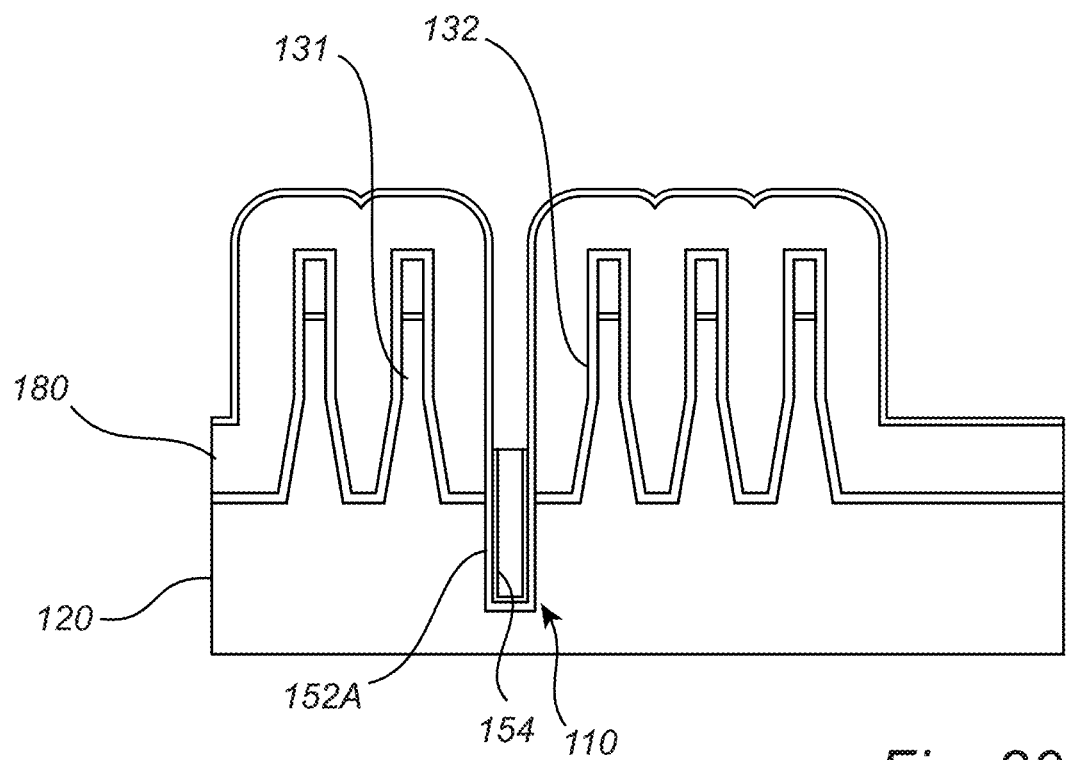

FIGS. 19 and 20 show a variation of a method of forming the buried metal line. The method proceeds in a similar manner as outlined in relation to FIGS. 10 to 18, but differs in the steps for depositing the metal line material in the metal line trench 112. FIG. 19 shows a structure similar to the one in FIG. 12, in which the metal line trench 112 and the gap defined by the spacer layer on the fins 131, 132 have been filled with a metal line material 114. The metal line metal deposition may be followed by a chemical mechanical planarization, CMP, and an etch-back process, in which the metal line material 114 and the metal barrier layer 154 may be etched back until a desired height of the metal line is achieved. The result is shown in FIG. 20. After the etch-back, the second liner 152A and the spacer layer 180 may be removed in a similar manner, as indicated in FIG. 16.

In the above, the methods have been disclosed with reference to semiconductor structures in the form of fins. However, the methods are also applicable for forming a buried metal line between a pair of semiconductor structures in the form of, for instance, a pair of lateral semiconductor nanowires, or a pair of vertical semiconductor nanosheets. Nanowires may be formed with a rounded or square cross-sectional shape. Nanosheets may be formed with an oblong rectangular cross-sectional shape (however typically with a length to width ratio smaller than a length to width ratio of a semiconductor fin). A plurality of pillars may be formed on the substrate, for example, in an array having a plurality of rows and columns wherein a buried metal line may be formed between pillars of adjacent pairs of rows or columns of the array. The metal line trench may thus be formed to extend between and along a plurality of corresponding pairs of pillars arranged along the same rows (or columns) as the pair of pillars. The nanowires and nanosheets may be used for forming lateral channel devices, such as gate-all-around VFETs.

While only a limited number of examples were discussed above, it is readily appreciated by a person skilled in the art that examples other than those disclosed above are equally possible. These other examples are understood to fall within the scope of the claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a buried metal line in a semiconductor substrate, the method comprising:
   conformally depositing a first liner over the semiconductor substrate;
   depositing a spacer layer over the first liner;
   forming, in the semiconductor substrate and at a level below a base of each semiconductor structure, a trench between a pair of semiconductor structures that protrude from the semiconductor substrate;
   conformally depositing a second liner over the semiconductor substrate;
   conformally depositing a barrier layer over the second liner;
   selectively removing the barrier layer outside of the trench, wherein the barrier layer in the trench is disposed on the second liner;
   selectively depositing a metal line material in the trench to thereby form a metal line in the trench, wherein the barrier layer is configured to promote deposition of the metal material in the trench, and wherein the second liner is configured to inhibit deposition of the metal material outside of the trench;
   subsequent to selectively depositing the metal line material, conformally depositing a continuous capping liner over the metal line material and the pair of semiconductor structures; and
   embedding the pair of semiconductor structures in an insulating layer.

2. The method according to claim 1, wherein a height of the metal line exceeds a depth of the trench.

3. The method according to claim 1, wherein the metal line corresponds to a buried power rail.

4. The method according to claim 1, wherein the pair of semiconductor structures are formed by a pair of semiconductor fins.

5. The method according to claim 1, wherein conformally depositing the continuous capping liner comprises depositing a $Si_3N_4$ material.

6. The method according to claim 1, further comprising:
   subsequent to selectively depositing the metal line material, removing the spacer layer and a portion of the second liner outside of the trench, such that the first liner is disposed outside of the trench and the second liner is disposed within the trench.

7. The method according to claim 1, wherein the spacer layer is conformally deposited over the first liner.

8. The method according to claim 1, wherein the spacer layer is deposited over sidewall surfaces of the pair of semiconductor structures such that a gap is defined by the spacer layer between the pair of semiconductor structures.

* * * * *